United States Patent

Katsube

(10) Patent No.: US 9,686,872 B2
(45) Date of Patent: Jun. 20, 2017

(54) CERAMIC MULTILAYER SUBSTRATE

(71) Applicant: Murata Manufacturing Co., Ltd., Kyoto (JP)

(72) Inventor: Tsuyoshi Katsube, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 192 days.

(21) Appl. No.: 14/476,859

(22) Filed: Sep. 4, 2014

(65) Prior Publication Data

US 2015/0096791 A1  Apr. 9, 2015

(30) Foreign Application Priority Data

Oct. 8, 2013  (JP) .................................. 2013-211256

(51) Int. Cl.
 H05K 1/11 (2006.01)
 H05K 3/46 (2006.01)

(52) U.S. Cl.
 CPC ... *H05K 3/4629* (2013.01); *H05K 2201/0195* (2013.01); *H05K 2201/068* (2013.01); *H05K 2201/096* (2013.01); *H05K 2201/09827* (2013.01)

(58) Field of Classification Search
 CPC ........... H05K 3/4629; H05K 2201/096; H05K 2201/068; H05K 2201/09827; H05K 1/115
 See application file for complete search history.

(56) References Cited

U.S. PATENT DOCUMENTS

2012/0145445 A1* 6/2012 Arai .................. H01L 23/49827
 174/260

FOREIGN PATENT DOCUMENTS

| CN | 102484950 A | 5/2012 |
|---|---|---|
| JP | H04-93096 A | 3/1992 |
| JP | 2000-312063 A | 11/2000 |
| JP | 2000-012736 A | 1/2001 |
| JP | 2001-160683 A | 6/2001 |
| JP | 2003-258433 A | 9/2003 |
| JP | 2008-186909 A | 8/2008 |
| JP | 2009-010141 A | 1/2009 |
| JP | 2009-231414 A | 10/2009 |

(Continued)

OTHER PUBLICATIONS

Kyocera Corp JP2010-153554 English Translation.*

(Continued)

*Primary Examiner* — Steven T Sawyer
(74) *Attorney, Agent, or Firm* — Pearne & Gordon, LLP (57) ABSTRACT

In a ceramic multilayer substrate formed by stacking and firing a plurality of insulating layers, the insulating layer in an uppermost surface layer includes a ceramic layer, a contraction suppression layer stacked on the ceramic layer, and a surface-layer via conductor penetrating through the ceramic layer and the contraction suppression layer and having a tapered shape gradually tapering toward the lower layer side. The surface-layer via conductor has an end surface that is exposed from the contraction suppression layer forming the surface of the ceramic multilayer substrate, and that is directly connected to a terminal of a component mounted to the surface of the ceramic multilayer substrate. A weight ratio of alumina contained in the contraction suppression layer is set higher than a weight ration of alumina contained in the ceramic layer.

16 Claims, 3 Drawing Sheets

(56) References Cited

FOREIGN PATENT DOCUMENTS

| JP | 2010-153554 A | 7/2010 |
| JP | 2011-077487 A | 4/2011 |
| JP | 2012-151284 A | 8/2012 |
| WO | 2011/024790 A1 | 3/2011 |

OTHER PUBLICATIONS

NKG Spark Plug JP2000-012736 English Translation.*
Kyocera Corp JP2012-151284 English Translation.*
Kyocera Corp JP2000-312063 English Translation; Kyocera Corp JP2003-258433 English Translation.*
Office Action issued in corresponding Japanese Patent Application No. 2013-211256 dated Aug. 18, 2015.

* cited by examiner

CERAMIC MULTILAYER SUBSTRATE

BACKGROUND OF THE INVENTION

1. Field of the Invention

The present invention relates to a ceramic multilayer substrate that is formed by stacking and firing a plurality of insulating layers made of ceramic materials.

2. Description of the Related Art

Ceramic multilayer substrates are widely used as substrates on which circuits of various electronic devices, e.g., cellular phones, are formed. A manufacturing method for the ceramic multilayer substrate includes, for example, the steps of forming a via hole in a ceramic green sheet, filling a conductive material in the via hole to form a via conductor that serves as an interlayer connection conductor, and then forming wiring electrodes on a principal surface of the ceramic green sheet. The ceramic multilayer substrate is obtained by stacking and firing the plural ceramic green sheets each of which has been formed in a similar manner.

It is known that the above-mentioned type of ceramic green sheet is contracted when fired. Furthermore, individual ceramic green sheets undergo variations in amounts of contraction thereof. In particular, if variations in amounts of contraction occur in the direction of principal surfaces (i.e., in the plane direction) of the ceramic green sheets, positions of the wiring electrodes and the via conductors formed in the individual ceramic green sheets are deviated, thus causing a possibility that proper connection between the wiring electrodes and the via conductors, which are to be interconnected, may not be obtained between the adjacent ceramic green sheets. In recent years, the above-mentioned problem has become more significant because further reduction in width of the wiring electrodes and size of the via conductors formed on the ceramic multilayer substrate has been demanded with downsizing of electronic devices.

Figure 5:
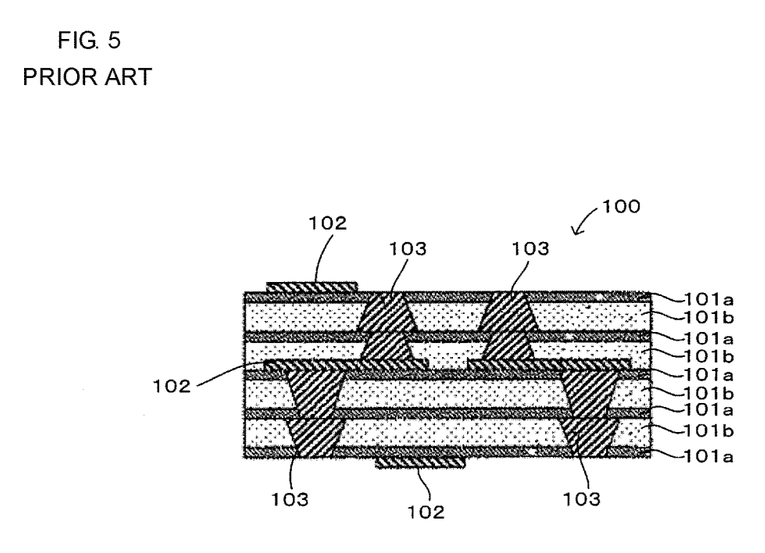
FIG. 5 is a sectional view of a ceramic multilayer substrate of related art.

In view of the situations described above, a ceramic multilayer substrate has been proposed which can suppress contraction of the ceramic multilayer substrate caused in the plane direction during firing (see Japanese Unexamined Patent Application Publication No. 2008-186909 (paragraphs 0015 to 0018, FIG. 1). In a proposed ceramic multilayer substrate 100, as illustrated in FIG. 5, a first insulating layer 101a and a second insulating layer 101b are alternately stacked, and various wiring electrodes 102 and via conductors 103 are formed inside or on surfaces of the insulating layers. In this case, the first insulating layer 101a and the second insulating layer 101b are made of glass ceramics that have contraction starting temperatures and contraction end temperatures different from each other in firing of the ceramic multilayer substrate 100. Respective materials of the first insulating layer 101a and the second insulating layer 101b are selected such that contraction with firing of the second insulating layer 101b starts after the end of contraction with firing of the first insulating layer 101a.

By selecting the materials as mentioned above, because the contraction with firing of the adjacent second insulating layer 101b is not yet started at the time of the start of the contraction with firing of the first insulating layer 101a, the contraction of the first insulating layer 101a in the direction of the principal surface (i.e., in the plane direction) is suppressed. Moreover, because the contraction with firing of the adjacent first insulating layer 101a is already ended at the time of the start of the contraction with firing of the second insulating layer 101b, the contraction of the second insulating layer 101b in the plane direction is suppressed. As a result, the contraction of the ceramic multilayer substrate in the plane direction is suppressed, and the positions where the wiring electrodes 102 and the via conductors 103 are formed on and in the insulating layers 101a and 101b are prevented from being deviated when the ceramic multilayer substrate 100 is fired.

However, the above-described ceramic multilayer substrate 100 has a property that the contraction in the plane direction is suppressed, while an amount of contraction in a direction (stacking direction) perpendicular to the plane direction is increased. Furthermore, the via conductors 103 formed inside the ceramic multilayer substrate 100 are contracted during the firing without substantially being affected by the insulating layers 101a and 101b, and the amount of contraction of each via conductor 103 in the stacking direction is smaller than the amount of contraction of each of the insulating layers 101a and 101b in the stacking direction. Therefore, when another via conductor 103 is arranged just under some one via conductor 103 formed in an uppermost surface layer, for example, there occurs a phenomenon that, during the firing of the ceramic multilayer substrate 100, the via conductor 103 in the uppermost surface layer is pushed up by the other via conductor 103 and is protruded from the surface of the ceramic multilayer substrate 100. Such a protrusion of the via conductor 103 is undesired because the protrusion may deteriorate mountability of a component that is mounted to the surface of the ceramic multilayer substrate 100.

In the ceramic multilayer substrate 100, to cope with the above-mentioned problem, the via conductor 103 in the uppermost surface layer is formed to have a smaller sectional area on the uppermost surface side than a sectional area on the inner layer side. As a result, the protrusion of the via conductor 103 in the uppermost surface layer is prevented for the reason that, during the firing, the insulating layers 101a and 101b covering lateral peripheral surfaces of the via conductor 103 in the uppermost surface layer function as resistances against pushing by the via conductor 103, which is positioned just under the above-mentioned via conductor 103.

On the other hand, when terminals of a surface-mounted component mounted to the surface of the ceramic multilayer substrate 100 are connected to exposed end surfaces of the via conductors 103 in the uppermost surface layer, strength in connection of the component is increased in some cases by separately forming land electrodes for mounting on the relevant via conductors 103, and by connecting the land electrodes to the component terminals. However, because the land electrodes are formed in larger areas than areas of the end surfaces of the via conductors 103 in the uppermost surface layer, which are exposed at the surface of the ceramic multilayer substrate 100, a difficulty arises in adaptation to mounting of a component, such as an IC, having terminals arranged at a high density.

To be adapted for mounting of the high-density component, a technique for directly connecting the via conductors 103 to the component terminals without providing the land electrodes has been proposed in recent years. However, when the proposed technique is applied to the above-described ceramic multilayer substrate 100, sufficient strength in connection to the surface-mounted component cannot be obtained in some cases because the via conductor 103 in the uppermost surface layer is formed to have a sectional area that gradually reduces toward the uppermost surface side.

One conceivable solution to the above-mentioned problem is to form the via conductor 103, which is positioned in the uppermost layer of the ceramic multilayer substrate 100 and is directly connected to the terminal of the surface-mounted component, in such a shape that a sectional shape of the via conductor 103 gradually increases toward the uppermost surface side, thereby increasing an area where the via conductor 103 is connected to the surface-mounted component. In the above-described ceramic multilayer substrate 100, however, the contraction of the insulating layers 101a and 101b is suppressed during the firing, whereas the contraction of the via conductor 103 is not suppressed. Accordingly, a difference in amount of contraction during the firing is caused between each of the insulating layers 101a and 101b and the via conductor 103, and a gap is generated between the via conductor 103 and each of the insulating layers 101a and 101b.

If moisture enters the ceramic multilayer substrate 100 through the above-mentioned gap, there is a possibility that insulation resistances of the insulating layers 101a and 101b may be reduced due to electrochemical migration occurred inside the ceramic multilayer substrate 100, or that the moisture having entered the inside may be expanded with, e.g., heat applied when the surface-mounted component is mounted, thus causing damage to the insulating layers 101a and 101b due to an expansion force of the moisture. Furthermore, if the expansion force acts on a solder for mounting of the component when the solder is in a molten state, there is a possibility of the so-called solder flash that the solder is scattered to the surroundings and the adjacent via conductors are short-circuited.

SUMMARY OF THE INVENTION

In view of the problems described above, an object of the present invention is to, in a ceramic multilayer substrate capable of suppressing contraction during firing, allow mounting of a component having terminals arranged at a high density, ensure sufficient strength in connection to the component, and prevent moisture from entering the inside of the ceramic multilayer substrate from the outside.

To achieve the above object, according to preferred embodiments of the present invention, there is provided a ceramic multilayer substrate formed by stacking and firing a plurality of insulating layers made of ceramic materials, wherein the insulating layer in an uppermost surface layer includes a first ceramic layer, a second ceramic layer stacked on the first ceramic layer and functioning to suppress contraction, and a surface-layer via conductor penetrating through the first and second ceramic layers and having a tapered shape gradually tapering toward a lower layer side, the surface-layer via conductor having an end surface that is exposed from the second ceramic layer and that is directly connected to a terminal of a component mounted to a surface of the second ceramic layer, and at least the second ceramic layer contains a material suppressing thermal contraction of the surface-layer via conductor or deforming in compliance with the thermal contraction of the surface-layer via conductor.

In the ceramic multilayer substrate described above, the end surface of the surface-layer via conductor, which is exposed from the second ceramic layer of the uppermost insulating layer defining the surface of the ceramic multilayer substrate, is directly connected to the terminal of the component mounted to the surface of the ceramic multilayer substrate without interposition of land electrodes that are provided in the related art. Accordingly, the surface-layer via conductor can be arranged at a narrower pitch with omission of the land electrodes, and a component having terminals arranged at a higher density can be mounted.

Furthermore, since the surface-layer via conductor is formed in the tapered shape gradually tapering toward the lower layer side, an area of the end surface of the surface-layer via conductor exposed from the second ceramic layer can be increased in comparison with the case where, as in the above-described ceramic multilayer substrate of the related art, the surface-layer via conductor is formed to have a smaller sectional area on the surface side than a sectional area on the inner layer side. In other words, since an area for connection to the component mounted to the surface of the ceramic multilayer substrate can be increased in comparison with that in the above-described ceramic multilayer substrate of the related art, sufficient strength in connection to the component can be ensured.

Moreover, since at least the second ceramic layer contains a material suppressing thermal contraction of the surface-layer via conductor or deforming in compliance with the thermal contraction of the surface-layer via conductor during the firing, a gap can be prevented from being generated between the surface-layer via conductor and the second ceramic layer forming the surface of the ceramic multilayer substrate. It is hence possible to prevent moisture from entering the inside of the ceramic multilayer substrate from the surface thereof, and to avoid the occurrence of not only electrochemical migration inside the ceramic multilayer substrate, which is attributable to moisture having entered the inside, but also damage of the insulating layers and the so-called solder flash.

A weight ratio of alumina contained in the second ceramic layer may be set higher than a weight ratio of alumina contained in the first ceramic layer. In the via conductor made of Cu, for example, the via conductor develops a coupling reaction with alumina contained in each of the first ceramic layer and the second ceramic layer when the ceramic multilayer substrate is fired. Moreover, in the via conductor, like the surface-layer via conductor, formed in the tapered shape gradually tapering toward the lower layer side, an amount of contraction during the firing is larger in a portion of the via conductor positioned nearer to the surface layer side and having a larger sectional area than a sectional area in a portion of the via conductor positioned nearer to the inner layer side. Therefore, a gap between the second ceramic layer and the surface-layer via conductor is larger than a gap between the first ceramic layer and the surface-layer via conductor. By setting the weight ratio of alumina contained in the second ceramic layer on the surface layer side to be higher than the weight ratio of alumina contained in the first ceramic layer, the coupling reaction between the second ceramic layer and the surface-layer via conductor during the firing is promoted in comparison with that between the first ceramic layer and the surface-layer via conductor. Thus, thermal contraction during the firing can be suppressed in the portion of the surface-layer via conductor nearer to the surface layer side. As a result, the generation of a gap between the surface-layer via conductor and the second ceramic layer can be prevented.

A weight ratio of a glass ingredient contained in the second ceramic layer may be set higher than a weight ratio of a glass ingredient contained in the first ceramic layer. When the insulating layer contains a glass ingredient, the insulating layer deforms in compliance with thermal contraction of the surface-layer via conductor due to viscous flowage of the glass ingredient during the firing of the ceramic multilayer substrate in a way to fill a gap that is otherwise generated between the insulating layer and the surface-layer via conductor. Accordingly, by setting the weight ratio of the glass ingredient contained in the second ceramic layer to be higher than the weight ratio of the glass ingredient contained in the first ceramic layer, a characteristic of the second ceramic layer deforming in compliance with the thermal contraction of the surface-layer via conductor can be improved to be higher than a characteristic of the first ceramic layer, and a gap can be prevented from being generated between the surface-layer via conductor and the second ceramic layer.

A contraction starting temperature of the second ceramic layer during firing may be set lower than a contraction starting temperature of the first ceramic layer. By so setting, the second ceramic layer on the surface side is contracted earlier when the ceramic multilayer substrate is fired. Therefore, the second ceramic layer can more easily deform in compliance with the thermal contraction of the surface-layer via conductors. Hence, a gap can be prevented from being generated between the second ceramic layer and the surface-layer via conductor.

Another one of the insulating layers may be disposed under the insulating layer in the uppermost surface layer, the other one insulating layer including the first ceramic layer, the second ceramic layer, and an inner-layer via conductor penetrating through the first and second ceramic layers and formed in a tapered shape gradually tapering toward a lower layer side, and at least the second ceramic layer may contain a material suppressing thermal contraction of the inner-layer via conductor or deforming in compliance with the thermal contraction of the inner-layer via conductor. With those features, a gap can be prevented from being generated between the inner-layer via conductor and the second ceramic layer in the insulating layer on the inner side as well. As a result, the effect of preventing moisture from entering the inside of the ceramic multilayer substrate from the surface thereof can be further improved.

A weight ratio of a glass ingredient contained in the surface-layer via conductor may be set lower than a weight ratio of a glass ingredient contained in the inner-layer via conductor. When the via conductor contains the glass ingredient, the thermal contraction can be suppressed and the generation of a gap between the via conductor and each of the first and second ceramic layers during the firing can also be suppressed. However, when Ni/Au plating, for example, is performed on the end surface of the surface-layer via conductor, which is exposed from the second ceramic layer, in order to improve performance in connection with respect to a surface-mounted component, a plating layer tends to be less adhesive to the exposed end surface as an amount of the glass ingredient contained in the surface-layer via conductor increases. Thus, by setting the weight ratio of the glass ingredient contained in the surface-layer via conductor to be lower than the weight ration of the glass ingredient contained in the inner-layer via conductor, it is possible to prevent gaps from being generated between the first and second ceramic layers and each of the surface-layer via conductor and the inner-layer via conductor, and to facilitate formation of a plating layer over the end surface of the surface-layer via conductor exposed from the second ceramic layer.

Another one of the insulating layers may be disposed under the insulating layer in the uppermost surface layer, the other one insulating layer including the first ceramic layer, the second ceramic layer, and an inner-layer via conductor penetrating through the first and second ceramic layers and formed in a tapered shape that is reversed to the tapered shape of the surface-layer via conductor in a stacking direction, and the inner-layer via conductor may overlap with the surface-layer via conductor when viewed from above. As described, the inner-layer via conductor is formed in a tapered shape in a direction that is reversed to the tapered shape of the surface-layer via conductor in a stacking direction and the inner-layer via conductor overlaps with the surface-layer via conductor when viewed from above. Consequently, even when stress acting to push up the inner-layer via conductor from the lower layer side toward the surface layer side is generated, the first and second ceramic layers covering peripheral lateral surfaces of the inner-layer via conductor function as resistances against the push-up stress, and the surface-layer via conductor can be suppressed from protruding from the surface of the ceramic multilayer substrate.

A maximum sectional area of the surface-layer via conductor may be set smaller than a maximum sectional area of the inner-layer via conductor. With that feature, the surface-layer via conductor can be easily arranged at a narrower pitch. Increasing the maximum sectional area of the inner-layer via conductor is advantageous in that, when the inner-layer via conductor is arranged in the insulating layer just under the insulating layer in the uppermost surface layer and is directly connected to the surface-layer via conductor, performance in connection between both the insulating layers is improved.

The surface-layer via conductor may be a continuous body that includes a portion formed in the first ceramic layer and a portion formed in the second ceramic layer, and that has two tapered shapes defined by the two portions at different spreading slope angles, and the spreading slope angle of the tapered shape on the second ceramic layer side may be larger than the spreading slope angle of the tapered shape on the first ceramic layer side. With those features, the area of the end surface of the surface-layer via conductor exposed from the second ceramic layer can be easily increased to enhance strength in connection to the surface-mounted component.

With the preferred embodiments of the present invention, the end surface of the surface-layer via conductor, which is exposed from the second ceramic layer of the uppermost insulating layer defining the surface of the ceramic multilayer substrate, is directly connected to the terminal of the component mounted to the surface of the ceramic multilayer substrate without interposition of land electrodes that are provided in the related art. Accordingly, the surface-layer via conductor can be arranged at a narrower pitch with omission of the land electrodes, and a component having terminals arranged at a higher density can be mounted.

Furthermore, since the surface-layer via conductor is formed in the tapered shape gradually tapering toward the lower layer side, an area of the end surface of the surface-layer via conductor exposed from the second ceramic layer can be increased in comparison with the case where, as in the above-described ceramic multilayer substrate of the related art. In other words, since an area for connection to the component mounted to the surface of the ceramic multilayer substrate can be increased in comparison with that in the above-described ceramic multilayer substrate of the related art, sufficient strength in connection to the component can be ensured.

Moreover, since at least the second ceramic layer contains a material suppressing thermal contraction of the surface-layer via conductor or deforming in compliance with the thermal contraction of the surface-layer via conductor during firing, a gap can be prevented from being generated between the surface-layer via conductor and the second ceramic layer forming the surface of the ceramic multilayer substrate during the firing. It is hence possible to prevent moisture from entering the inside of the ceramic multilayer substrate from the surface thereof, and to avoid the occurrence of not only electrochemical migration inside the ceramic multilayer substrate, which is attributable to moisture having entered the inside, but also damage to the insulating layers and the so-called solder flash.

Other features, elements, characteristics and advantages of the present invention will become more apparent from the following detailed description of preferred embodiments of the present invention with reference to the attached drawings.

DESCRIPTION OF THE PREFERRED EMBODIMENTS

First Embodiment

Figure 1:
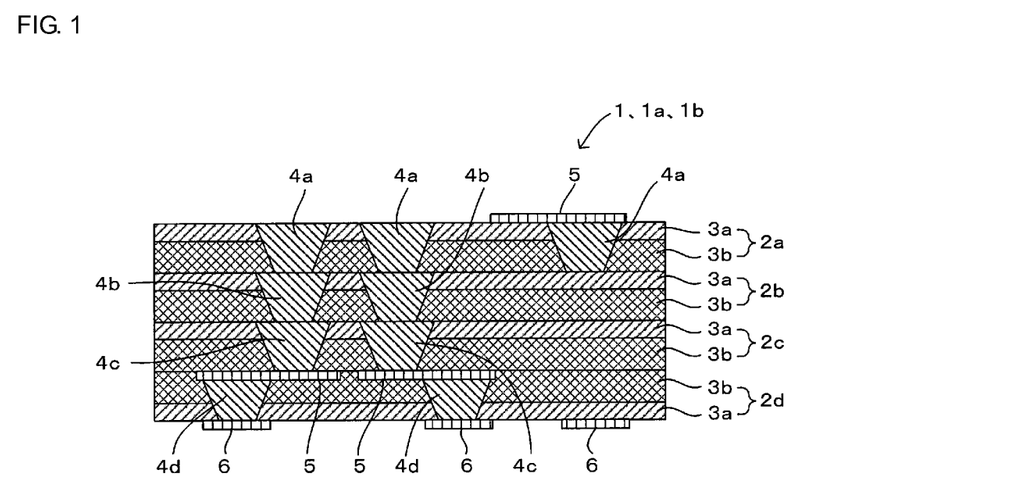
FIG. 1 is a sectional view of ceramic multilayer substrates according to first to third embodiments of the present invention.

A ceramic multilayer substrate 1 according to a first embodiment of the present invention will be described below with reference to FIG. 1. FIG. 1 is a sectional view of the ceramic multilayer substrate 1.

The ceramic multilayer substrate 1 according to the first embodiment includes, as illustrated in FIG. 1, a plurality of insulating layers 2a to 2d each including a ceramic layer 3b (corresponding to a "first ceramic layer" in the attached Claims of the present invention) and a contraction suppression layer 3a (corresponding to a "second ceramic layer" in the attached Claims of in the present invention) that suppresses contraction of the ceramic layer 3b during firing. The ceramic multilayer substrate 1 is formed by stacking the insulating layers 2a to 2d in a predetermined order, press-bonding the stacked insulating layers into a multilayer body, and firing the multilayer body. On that occasion, the uppermost insulating layer 2a and the inner insulating layers 2b and 2c positioned under the uppermost insulating layer 2a are each formed in an arrangement that the contraction suppression layer 3a is stacked on the ceramic layer 3b, whereas the positional relationship between the contraction suppression layer 3a and the ceramic layer 3b in the vertical direction is reversed to the above-mentioned relationship in the lowermost insulating layer 2d. This is because, if the ceramic layer 3b is arranged as an uppermost layer or a lowermost layer of the ceramic multilayer substrate 1, there is a possibility that the ceramic multilayer substrate 1 may be cracked. By reversing the vertical positional relationship between the ceramic layer 3b and the contraction suppression layer 3a in the lowermost insulating layer 2d, the contraction suppression layer 3a is arranged as the uppermost layer and the lowermost layer of the ceramic multilayer substrate 1. The total number of insulating layers forming the ceramic multilayer substrate 1 can be changed as required.

Each ceramic layer 3b is made of a ceramic material containing alumina, a glass ingredient, etc. During the firing of the ceramic multilayer substrate 1, a part (e.g., the glass ingredient) of the ceramic layer 3b infiltrates into the contraction suppression layer 3a, whereby the ceramic layer 3b and the contraction suppression layer 3a in adjacent relation are joined to each other. In this embodiment, each ceramic layer 3b is formed in a thickness ranging from about 3 to 50 μm.

Each contraction suppression layer 3a contains, as a main component, alumina that is fire resistant powder not sintered at the sintering temperature of ceramic material powder forming the ceramic layer 3b. The contraction suppression layer 3a further contains a glass ingredient as another material. Accordingly, the contraction suppression layer 3a is hard to contract during the firing of the ceramic multilayer substrate 1. Thus, the contraction suppression layer 3a suppresses contraction of the ceramic layer 3b joined to the contraction suppression layer 3a in adjacent relation. In particular, it suppresses contraction of the ceramic layer 3b in the direction of a principal surface thereof (i.e., in the plane direction). Furthermore, in this embodiment, material composition ratios in the contraction suppression layer 3a are set such that a weight ratio of alumina contained in the contraction suppression layer 3a is higher than a weight ratio of alumina contained in the ceramic layer 3b. In this embodiment, each contraction suppression layer 3a is formed in a thickness ranging from about 1 to 8 μm.

In the insulating layers 2a to 2d, via conductors 4a to 4d are formed respectively plural to penetrate through the ceramic layer 3b and the contraction suppression layer 3a in tapered shapes gradually tapering toward the lower layer side. The via conductors 4a to 4d are each made of a metal, e.g., Cu, Al or Ag. Furthermore, various wiring electrodes 5 are disposed on principal surfaces of predetermined ones of the insulating layers 2a to 2d, and outer electrodes 6 for connecting the ceramic multilayer substrate 100 to the outside are formed on a surface of the contraction suppression layer 3a of the lowermost insulating layer 2d, the surface being positioned on the side opposite to the ceramic layer 3b and serving as a lowermost surface of the ceramic multilayer substrate 1. Among the via conductors 4a formed in the uppermost insulating layer 2a, the via conductors 4a not connected to the wiring electrodes 5 are directly connected, at their end surfaces exposed from the uppermost contraction suppression layer 3a, to terminals of a component, e.g., an IC, which is mounted to the surface of the ceramic multilayer substrate 1, without interposition of any electrodes for mounting.

The via conductors 4b and 4c formed respectively in the inner insulating layers 2b and 2c are arranged at positions aligned, when viewed from above, with those ones of the via conductors 4a formed in the uppermost insulating layer 2a, which are not connected to the wiring electrodes 5. Adjacent ones of the via conductors 4a to 4c are directly connected to each other without interposition of the wiring electrodes 5. It is to be noted that the via conductors 4a directly connected to the component terminals correspond to "surface-layer via conductors" (hereinafter referred to also as "surface-layer via conductors 4a") in the attached Claims of the present invention, and the via conductors 4b to 4d formed in the insulating layers 2b to 2d positioned lower than the uppermost insulating layer 2a correspond to "inner-layer via conductors" (hereinafter referred to also as "inner-layer via conductors 4b to 4d") in the attached Claims of the present invention.

A glass ingredient may be added to each of the via conductors 4a to 4d. Addition of the glass ingredient is effective in suppressing contraction of the via conductors 4a to 4d when the ceramic multilayer substrate 1 is fired. When Ni/Au plating is performed on the end surface of the surface-layer via conductor 4a, which is exposed at the surface of the ceramic multilayer substrate 1, with a view of improving performance in connection with respect to the component mounted to the surface of the ceramic multilayer substrate 1, the weight ratio of the glass ingredient contained in the surface-layer via conductor 4a is preferably set lower than the weight ratio of the glass ingredient contained in the inner-layer via conductors 4b to 4d. Such setting facilitates formation of a plating layer over the surface-layer via conductor 4a. As another example for facilitating the formation of a plating layer over the surface-layer via conductor 4a, the weight ratio of the glass ingredient contained in a portion of the surface-layer via conductor 4a, which portion is formed in the contraction suppression layer 3a, may be set lower than the weight ratio of the glass ingredient contained in a portion of the surface-layer via conductor 4a, which portion is formed in the ceramic layer 3b, and lower than weight ratios of the a glass ingredient contained in the inner via conductors 4b to 4d.

(Manufacturing Method for Ceramic Multilayer Substrate 1)

A manufacturing method for the ceramic multilayer substrate 1 will be described below. The manufacturing method can also be similarly applied to other embodiments described later.

First, the insulating layers 2a to 2d constituting the ceramic multilayer substrate 1 are prepared. To explain the uppermost insulating layer 2a as an example, the contraction suppression layer 3a containing, as a main component, alumina that is fire resistant powder, and being in a paste-like state is coated by, e.g., printing, on a ceramic green sheet that forms the ceramic layer 3b. The coated contraction suppression layer 3a is then dried.

Next, at positions of the insulating layer 2a where the via conductors 4a are to be formed, through-holes are formed by employing a laser. At that time, by applying a laser beam from the upper surface side of the insulating layer 2a (i.e., from the side including the contraction suppression layer 3a), the through-holes are each formed in a tapered shape gradually tapering toward the lower layer side. The via conductors 4a are then formed by filling a conductive paste containing a metal, e.g., Cu, in the through-holes.

Next, the wiring electrodes 5 are formed on an upper surface of the contraction suppression layer 3a by, e.g., printing with the use of a conductive paste containing, e.g., Cu, whereby the insulating layer 2a is prepared. The other insulating layers 2b to 2d are then formed in a similar way. The ceramic multilayer substrate 1 is obtained by stacking the prepared insulating layers 2a to 2d in a predetermined order, and by press-bonding and firing the stacked insulating layers 2a to 2d.

Thus, according to the first embodiment described above, the end surfaces of the surface-layer via conductors 4a, which are exposed from the contraction suppression layer 3a of the uppermost insulating layer 2a defining the surface of the ceramic multilayer substrate 1, are directly connected to terminals of a component mounted to the surface of the ceramic multilayer substrate 1 without interposition of land electrodes that are provided in the related art. As a result, the surface-layer via conductors 4a can be arranged at a narrower pitch with omission of the land electrodes, and a component having terminals arranged at a higher density can be mounted.

Furthermore, since the surface-layer via conductors 4a are each formed in the tapered shape gradually tapering toward the lower layer side, an area of the end surface of the surface-layer via conductor 4a exposed from the contraction suppression layer 3a can be increased in comparison with the case where, as in the ceramic multilayer substrate 100 of the related art, the surface-layer via conductor 103 is formed to have a smaller sectional area on the surface side than a sectional area on the inner layer side. In other words, since an area for connection to the component mounted to the surface of the ceramic multilayer substrate 1 can be increased in comparison with that in the ceramic multilayer substrate 100 of the related art, sufficient strength in connection to the component can be ensured.

Moreover, according to the first embodiment, material composition ratios in the contraction suppression layer 3a are set such that, in the uppermost insulating layer 2a of the ceramic multilayer substrate 1, a weight ratio of alumina contained in the contraction suppression layer 3a forming the surface of the ceramic multilayer substrate 1 is higher than a weight ratio of alumina contained in the ceramic layer 3b. In each of the via conductors 4a to 4d made of Cu, for example, the via conductor develops a coupling reaction with the alumina contained in each of the ceramic layer 3b and the contraction suppression layer 3a when the ceramic multilayer substrate 1 is fired. Moreover, in the via conductors 4a to 4d each formed in the tapered shape gradually tapering toward the lower layer side, an amount of contraction during the firing is larger in a portion of the via conductor positioned nearer to the surface layer side and having a larger sectional area than an amount of contraction during the firing in a portion of the via conductor positioned nearer to the inner layer side. Therefore, a gap between the contraction suppression layer 3a of the uppermost insulating layer 2a and the surface-layer via conductor 4a, for example, is inherently larger than a gap between the ceramic layer 3b and the surface-layer via conductor 4a.

By setting the weight ratio of alumina contained in the contraction suppression layer 3a on the surface layer side to be larger than the weight ratio of alumina contained in the ceramic layer 3b, the coupling reaction between the contraction suppression layer 3a and the surface-layer via conductor 4a during the firing is promoted in comparison with that between the ceramic layer 3b and the surface-layer via conductor 4a. Thus, thermal contraction during the firing can be suppressed in the portion of the surface-layer via conductor 4a nearer to the surface layer side. In other words, the generation of a gap between the surface-layer via conductor 4a and the contraction suppression layer 3a can be prevented on the side where a larger gap is otherwise generated inherently. It is hence possible to prevent moisture from entering the inside of the ceramic multilayer substrate 1 from the surface thereof, and to avoid the occurrence of not only electrochemical migration inside the ceramic multilayer substrate 1, which is attributable to moisture having entered the inside, but also damage of the insulating layers 2a to 2d and the so-called solder flash.

The inner insulating layers 2b and 2c are also constituted similarly to the uppermost insulating layer 2a. More specifically, the contraction suppression layer 3a is stacked on the ceramic layer 3b, and material composition ratios in the contraction suppression layer 3a are set such that a weight ratio of alumina contained in the contraction suppression layer 3a is higher than a weight ratio of alumina contained in the ceramic layer 3b. Therefore, the effect of preventing moisture from entering the inside of the ceramic multilayer substrate 1 from the surface thereof can be further enhanced.

Second Embodiment

A ceramic multilayer substrate 1a according to a second embodiment of the present invention will be described below with reference to FIG. 1 illustrating the ceramic multilayer substrate 1 according to the first embodiment.

The ceramic multilayer substrate 1a according to the second embodiment is different from the ceramic multilayer substrate 1 according to the first embodiment in that, in each of the insulating layers 2a to 2d, a weight ratio of the glass ingredient contained in the contraction suppression layer 3a is higher than a weight ratio of the glass ingredient contained in the ceramic layer 3b. The other constituent elements are the same as those in the ceramic multilayer substrate 1 according to the first embodiment, and description of those constituent elements is omitted while they are denoted by the same reference symbols.

In general, when the insulating layers 2a to 2d contain glass ingredients, the insulating layer 2a, for example, deforms in compliance with thermal contraction of the surface-layer via conductor 4a due to viscous flowage of the glass ingredient during the firing of the ceramic multilayer substrate 1a in a way to fill a gap that is otherwise generated between the uppermost insulating layer 2a and the surface-layer via conductor 4a. Accordingly, by setting the weight ratio of the glass ingredient contained in the contraction suppression layer 3a, which forms the surface of the ceramic multilayer substrate 1a, to be higher than the weight ratio of a glass ingredient contained in the ceramic layer 3b, a characteristic of the contraction suppression layer 3a deforming in compliance with the thermal contraction of the surface-layer via conductor 4a can be improved to be higher than a characteristic of the ceramic layer 3b. It is hence possible to prevent a gap from being generated between the surface-layer via conductor 4a and the contraction suppression layer 3a, i.e., on the side where a larger gap is otherwise generated inherently. As a result, the same advantageous effect as that in the ceramic multilayer substrate 1 of the first embodiment can be obtained.

Third Embodiment

A ceramic multilayer substrate 1b according to a third embodiment of the present invention will be described below with reference to FIG. 1 illustrating the ceramic multilayer substrate 1 according to the first embodiment.

The ceramic multilayer substrate 1b according to the third embodiment is different from the ceramic multilayer substrate 1 according to the first embodiment in that a contraction starting temperature during the firing is different between each ceramic layer 3b and each contraction suppression layer 3a. The other constituent elements are the same as those in the ceramic multilayer substrate 1 according to the first embodiment, and description of those constituent elements is omitted while they are denoted by the same reference symbols.

In this embodiment, each ceramic layer 3b and each contraction suppression layer 3a are made of glass ceramics having different contraction starting temperatures and different contraction end temperatures when the ceramic multilayer substrate 1b is fired. Materials of each ceramic layer 3b and each contraction suppression layer 3a are selected such that the contraction starting temperature of the contraction suppression layer 3a is lower than contraction starting temperature of the ceramic layer 3b, and the firing contraction of the ceramic layer 3b is started after the end of the firing contraction of the contraction suppression layer 3a.

With the above-mentioned setting, since, at the time of the start of the firing contraction of the contraction suppression layer 3a, the firing contraction of the ceramic layer 3b adjacent to the relevant contraction suppression layer 3a is not yet started, the contraction of the contraction suppression layer 3a in the direction of a principal surface thereof (i.e., in plane direction) is suppressed. In addition, since, at the time of the start of the firing contraction of the ceramic layer 3b, the firing contraction of the contraction suppression layer 3a adjacent to the relevant ceramic layer 3b is already ended, the contraction of the ceramic layer 3b in the plane direction is suppressed. As a result, the contraction of the ceramic multilayer substrate 1b in the plane direction is suppressed.

Furthermore, for example, the contraction suppression layer 3a forming the surface of the ceramic multilayer substrate 1b is contracted earlier when the ceramic multilayer substrate 1b is fired. Therefore, the contraction suppression layer 3a can more easily deform in compliance with the thermal contraction of the surface-layer via conductors 4a. It is hence possible to prevent a gap from being generated between the contraction suppression layer 3a and the surface-layer via conductor 4a, i.e., on the side where a larger gap is otherwise generated inherently.

Fourth Embodiment

Figure 2:
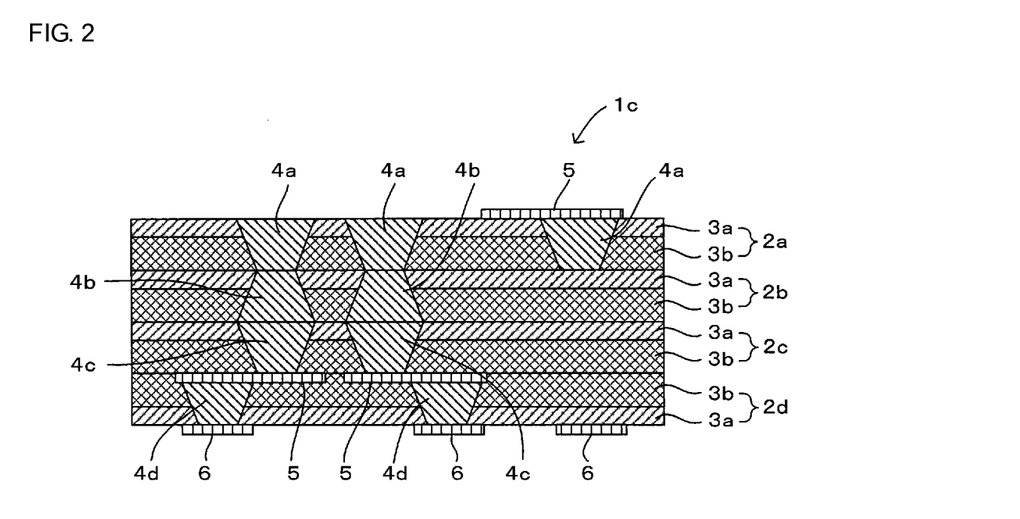
FIG. 2 is a sectional view of a ceramic multilayer substrate according to a fourth embodiment of the present invention.

A ceramic multilayer substrate 1c according to a fourth embodiment of the present invention will be described below with reference to FIG. 2. FIG. 2 is a sectional view of the ceramic multilayer substrate 1c according to the fourth embodiment.

The ceramic multilayer substrate 1c according to the fourth embodiment is different from the ceramic multilayer substrate 1 according to the first embodiment, which has been described above with reference to FIG. 1, in that the inner-layer via conductors 4b formed in the insulating layer 2b, which is disposed under the uppermost insulating layer 2a, is formed in a tapered shape reversed to that of the surface-layer via conductors 4a in the stacking direction, as illustrated in FIG. 2. The other constituent elements are the same as those in the ceramic multilayer substrate 1 according to the first embodiment, and description of those constituent elements is omitted while they are denoted by the same reference symbols.

In this embodiment, of the via conductors 4b and 4c each disposed at a position aligned with corresponding one of the surface-layer via conductors 4a when viewed from above, the inner-layer via conductor 4b formed in the insulating layer 2b, which is positioned adjacently just under the uppermost insulating layer 2a, is formed in a tapered shape reversed to that of the surface-layer via conductors 4a in the stacking direction, i.e., in a tapered shape gradually tapering toward the surface layer side.

As seen from the above discussion, the ceramic multilayer substrate 1c including the contraction suppression layer 3a has a property that the contraction in the plane direction is suppressed, while an amount of contraction in a direction (stacking direction) perpendicular to the plane direction is increased. Furthermore, the via conductors 4a to 4d formed inside the ceramic multilayer substrate 1c are contracted during the firing without substantially being affected by the insulating layers 2a to 2d, and the amount of contraction of each via conductor in the stacking direction is smaller than the amount of contraction of each of the insulating layers 2a to 2d in the stacking direction. Therefore, when the inner-layer via conductors 4b and 4c are each arranged at the position aligned with corresponding one of the surface-layer via conductors 4a when viewed from above, there occurs a phenomenon that, during the firing of the ceramic multilayer substrate 1c, the surface-layer via conductor 4a is pushed up by the inner-layer via conductors 4b and 4c and is protruded from the surface of the ceramic multilayer substrate 1c. Such a protrusion of the surface-layer via conductors 4a is undesired because the protrusion may deteriorate mountability of a component that is mounted to the surface of the ceramic multilayer substrate 1c.

In this embodiment, to cope with the above-mentioned problem, the inner-layer via conductor 4b overlapping with the surface-layer via conductor 4a when viewed from above is formed in a tapered shape, which is reversed to that of the surface-layer via conductor 4a in the stacking direction, such that the inner-layer via conductor 4b has a larger sectional area on the uppermost surface side than a sectional area on the inner layer side. As a result, the protrusion of the surface-layer via conductor 4a is prevented for the reason that, during the firing, the insulating layer 2b covering lateral peripheral surfaces of the inner-layer via conductor 4b functions as a resistance against pushing by the inner-layer via conductors 4b and 4c during the firing, which are overlapped with the surface-layer via conductor 4a when viewed from above.

It is to be noted that the above-described configuration is merely one example. As another example, the inner-layer via conductor 4c formed in the third insulating layer 2c counting from the surface layer may be formed in a tapered shape reversed to that of the surface-layer via conductor 4a. Alternatively, the inner-layer via conductors 4b and 4c overlapped with the surface-layer via conductor 4a may be both formed in the tapered shape reversed to that of the surface-layer via conductor 4a.

Fifth Embodiment

Figure 3:
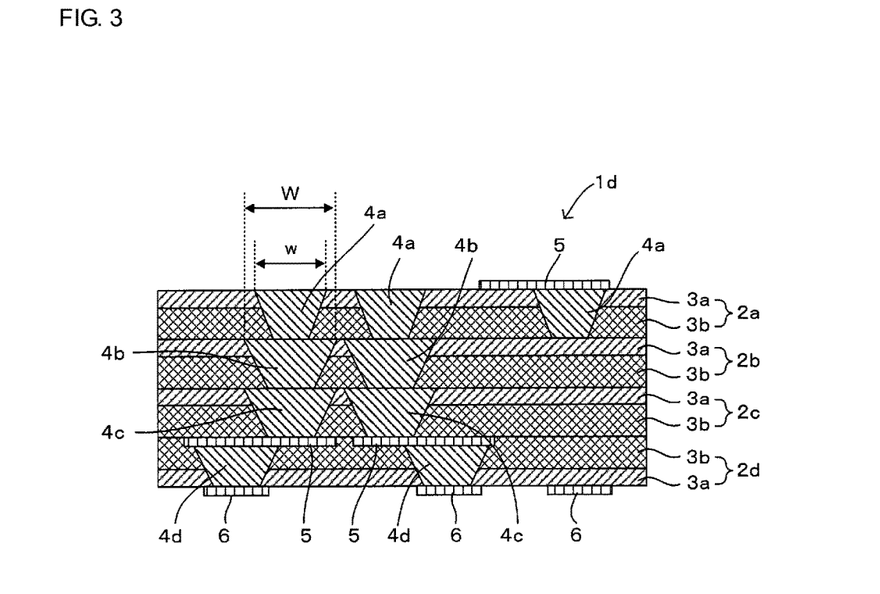
FIG. 3 is a sectional view of a ceramic multilayer substrate according to a fifth embodiment of the present invention.

A ceramic multilayer substrate 1d according to a fifth embodiment of the present invention will be described below with reference to FIG. 3. FIG. 3 is a sectional view of the ceramic multilayer substrate 1d.

The ceramic multilayer substrate 1d according to the fifth embodiment is different from the ceramic multilayer substrate 1 according to the first embodiment, which has been described above with reference to FIG. 1, in that a maximum sectional area of the surface-layer via conductor 4a is smaller than a maximum sectional area of each of the inner-layer via conductors 4b to 4d, as illustrated in FIG. 3. The other constituent elements are the same as those in the ceramic multilayer substrate 1 according to the first embodiment, and description of those constituent elements is omitted while they are denoted by the same reference symbols.

In this embodiment, a maximum size w of the sectional area of the surface-layer via conductor 4a is set smaller than a maximum size W of the sectional area of each of the inner-layer via conductors 4b to 4d (W>w). Stated in another way, a maximum sectional area of the surface-layer via conductor 4a is set smaller than a maximum sectional area of each of the inner-layer via conductors 4b to 4d. As a result, a narrower pitch of the surface-layer via conductors 4a can be obtained more easily. Furthermore, increasing the maximum sectional areas of the inner-layer via conductors 4b to 4d is advantageous in that, when the surface-layer via conductor 4a and the inner-layer via conductor 4b are connected to each other, for example, performance in connection between both the via conductors can be increased.

(Modification of Surface-Layer Via Conductor)

Figure 4:
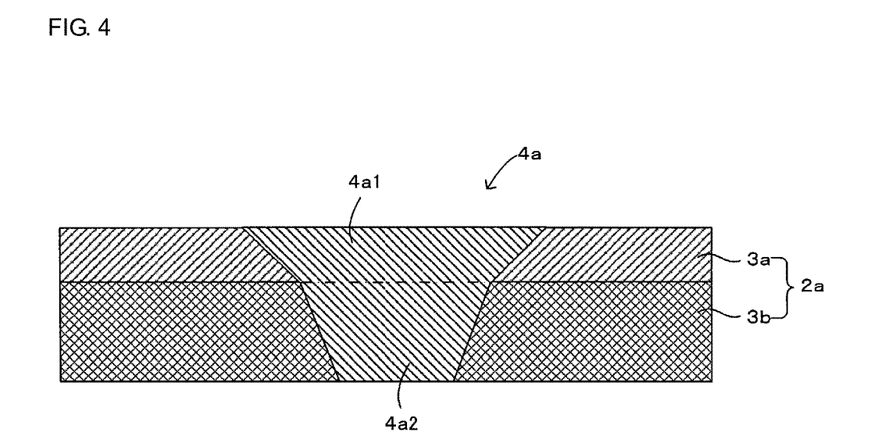
FIG. 4 is an illustration to explain a modification of a surface-layer via conductor.

A modification of the surface-layer via conductor 4a will be described below with reference to FIG. 4. FIG. 4 is an illustration to explain a modification of the surface-layer via conductor 4a, and it is an enlarged sectional view illustrating the surface-layer via conductor 4a and thereabout.

As illustrated in FIG. 4, the surface-layer via conductor 4a may be formed as a continuous body that includes a portion 4a1 formed in the contraction suppression layer 3a and a portion 4a2 formed in the ceramic layer 3b, and that has two tapered shapes spreading at different slope angles. In that case, the spreading slope angle of the tapered shape on the side including the contraction suppression layer 3a is set larger than the spreading slope angle of the tapered shape on the side including the ceramic layer 3b. As a result, an area of the end surface of the surface-layer via conductor 4a, which is exposed at the surface of each of the ceramic multilayer substrates 1 and 1a to 1d can be more easily increased, and strength in connection to the surface-mounted component can be enhanced.

It is to be noted that the present invention is not limited to the above-described embodiments, and that the present invention can be modified in various ways other than described above within the scope not departing from the gist of the present invention. While the above modification of the surface-layer via conductor 4a has been described in connection with the case where the surface-layer via conductor 4a is formed as the continuous body having two tapered shapes that spread at different slope angles to increase an area for connection to the component, the tapered shapes may be formed at different spreading slope angles, for example, between the surface-layer via conductor 4a and the inner-layer via conductor 4b. In that case, the area for connection to the component can be easily increased by setting the spreading slope angle of the tapered shape of the surface-layer via conductor 4a to a larger value.

Furthermore, the features of the ceramic multilayer substrates 1 and 1a according to the first and second embodiments may be combined with each other. In other words, respective weight ratios of the alumina and the glass ingredient contained in the contraction suppression layer 3a may be set higher than weight ratios of alumina and a glass ingredient contained in the ceramic layer 3b. As a result, the effect of preventing a gap from being generated between the surface-layer via conductor 4a and the contraction suppression layer 3a during the firing can be further enhanced.

The present invention can be applied to various types of ceramic multilayer substrates that are formed by stacking and firing a plurality of insulating layers made of ceramic materials.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A ceramic multilayer substrate formed by stacking and firing a plurality of insulating layers made of ceramic materials, wherein: the insulating layer in an uppermost surface layer includes a first ceramic layer, a second ceramic layer directly stacked on the first ceramic layer and configured to suppress contraction, and a surface-layer via conductor penetrating through the first and second ceramic layers and having a tapered shape gradually tapering toward a lower layer side, the surface-layer via conductor having an end surface that is exposed from the second ceramic layer and that is directly connected to a terminal of a component mounted to a surface of the second ceramic layer, and at least the second ceramic layer contains a material suppressing thermal contraction of the surface-layer via conductor or deforming in compliance with the thermal contraction of the surface-layer via conductor, wherein a weight ratio of alumina contained in the second ceramic layer is higher than a weight ratio of alumina contained in the first ceramic layer; wherein the surface-layer via conductor is a continuous body that includes a portion formed in the first ceramic layer and a portion formed in the second ceramic layer, and that has two tapered shapes defined by the two portions at different spreading slope angles, and a spreading slope angle of the tapered shape on the second ceramic layer side is larger than a spreading slope angle of the tapered shape on the first ceramic layer side.

2. The ceramic multilayer substrate according to claim 1, wherein a weight ratio of a glass ingredient contained in the second ceramic layer is higher than a weight ratio of a glass ingredient contained in the first ceramic layer.

3. The ceramic multilayer substrate according to claim 1, wherein a contraction starting temperature of the second ceramic layer during firing is lower than a contraction starting temperature of the first ceramic layer during firing.

4. The ceramic multilayer substrate according to claim 1, wherein another one of the insulating layers is disposed under the insulating layer in the uppermost surface layer, said other one insulating layer including at least one of the first ceramic layer, at least one of the second ceramic layer, and an inner-layer via conductor penetrating through the at least one of the first ceramic layers and the at least one of the second ceramic layers of the other one insulating layer and formed in a tapered shape gradually tapering toward a lower layer side of the other one insulating layer, and
 at least the one of the second ceramic layers of the other one insulating layer contains a material suppressing thermal contraction of the inner-layer via conductor or deforming in compliance with the thermal contraction of the inner-layer via conductor.

5. The ceramic multilayer substrate according to claim 4, wherein a weight ratio of a glass ingredient contained in the surface-layer via conductor is lower than a weight ratio of a glass ingredient contained in the inner-layer via conductor.

6. The ceramic multilayer substrate according to claim 1, wherein another one of the insulating layers is disposed under the insulating layer in the uppermost surface layer, said other one of the insulating layers including at least one of the first ceramic layers, at least one of the second ceramic layers, and an inner-layer via conductor penetrating through the at least one of the first layers and the at least one of the second ceramic layers and formed in a tapered shape that is reversed to the tapered shape of the surface-layer via conductor in a stacking direction, and
 the inner-layer via conductor is overlapping with the surface-layer via conductor when viewed in a direction perpendicular to the surface of the second ceramic layer.

7. The ceramic multilayer substrate according to claim 4, wherein a maximum sectional area of the surface-layer via conductor is smaller than a maximum sectional area of the inner-layer via conductor.

8. The ceramic multilayer substrate according to claim 1, wherein another one of the insulating layers is disposed under the insulating layer in the uppermost surface layer, said other one insulating layer including at least one of the first ceramic layer, at least one of the second ceramic layer, and an inner-layer via conductor penetrating through the at least one of the first ceramic layers and the at least one of the second ceramic layers of the other one insulating layer and formed in a tapered shape gradually tapering toward a lower layer side of the other one insulating layer, and
 at least the one of the second ceramic layers of the other one insulating layer contains a material suppressing thermal contraction of the inner-layer via conductor or deforming in compliance with the thermal contraction of the inner-layer via conductor.

9. The ceramic multilayer substrate according to claim 2, wherein another one of the insulating layers is disposed under the insulating layer in the uppermost surface layer, said other one insulating layer including at least one of the first ceramic layer, at least one of the second ceramic layer, and an inner-layer via conductor penetrating through the at least one of the first ceramic layers and the at least one of the second ceramic layers of the other one insulating layer and formed in a tapered shape gradually tapering toward a lower layer side of the other one insulating layer, and
 at least the one of the second ceramic layers of the other one insulating layer contains a material suppressing thermal contraction of the inner-layer via conductor or deforming in compliance with the thermal contraction of the inner-layer via conductor.

10. The ceramic multilayer substrate according to claim 3, wherein another one of the insulating layers is disposed under the insulating layer in the uppermost surface layer, said other one insulating layer including at least one of the first ceramic layer, at least one of the second ceramic layer, and an inner-layer via conductor penetrating through the at least one of the first ceramic layers and the at least one of the second ceramic layers of the other one insulating layer and formed in a tapered shape gradually tapering toward a lower layer side of the other one insulating layer, and
 at least the one of the second ceramic layers of the other one insulating layer contains a material suppressing thermal contraction of the inner-layer via conductor or deforming in compliance with the thermal contraction of the inner-layer via conductor.

11. The ceramic multilayer substrate according to claim 1, wherein another one of the insulating layers is disposed under the insulating layer in the uppermost surface layer, said other one of the insulating layers including at least one of the first ceramic layers, at least one of the second ceramic layers, and an inner-layer via conductor penetrating through the at least one of the first layers and the at least one of the second ceramic layers and formed in a tapered shape that is reversed to the tapered shape of the surface-layer via conductor in a stacking direction, and
 the inner-layer via conductor is overlapping with the surface-layer via conductor when viewed in a direction perpendicular to the surface of the second ceramic layer.

12. The ceramic multilayer substrate according to claim 2, wherein another one of the insulating layers is disposed under the insulating layer in the uppermost surface layer, said other one of the insulating layers including at least one of the first ceramic layers, at least one of the second ceramic layers, and an inner-layer via conductor penetrating through the at least one of the first layers and the at least one of the second ceramic layers and formed in a tapered shape that is reversed to the tapered shape of the surface-layer via conductor in a stacking direction, and the inner-layer via conductor is overlapping with the surface-layer via conductor when viewed in a direction perpendicular to the surface of the second ceramic layer.

13. The ceramic multilayer substrate according to claim 3, wherein another one of the insulating layers is disposed under the insulating layer in the uppermost surface layer, said other one of the insulating layers including at least one of the first ceramic layers, at least one of the second ceramic layers, and an inner-layer via conductor penetrating through the at least one of the first layers and the at least one of the second ceramic layers and formed in a tapered shape that is reversed to the tapered shape of the surface-layer via conductor in a stacking direction, and the inner-layer via conductor is overlapping with the surface-layer via conductor when viewed in a direction perpendicular to the surface of the second ceramic layer.

14. The ceramic multilayer substrate according to claim 4, wherein another one of the insulating layers is disposed under the insulating layer in the uppermost surface layer, said other one of the insulating layers including at least one of the first ceramic layers, at least one of the second ceramic layers, and an inner-layer via conductor penetrating through the at least one of the first layers and the at least one of the second ceramic layers and formed in a tapered shape that is reversed to the tapered shape of the surface-layer via conductor in a stacking direction, and the inner-layer via conductor is overlapping with the surface-layer via conductor when viewed in a direction perpendicular to the surface of the second ceramic layer.

15. The ceramic multilayer substrate according to claim 5, wherein a maximum sectional area of the surface-layer via conductor is smaller than a maximum sectional area of the inner-layer via conductor.

16. The ceramic multilayer substrate according to claim 6, wherein a maximum sectional area of the surface-layer via conductor is smaller than a maximum sectional area of the inner-layer via conductor.

* * * * *